United States Patent [19]
Koga et al.

[11] Patent Number: 4,998,106
[45] Date of Patent: Mar. 5, 1991

[54] REFERENCE VOLTAGE REGULATION APPARATUS FOR AN AUTOMATIC GAIN CONTROL SYSTEM

[75] Inventors: Toyokastu Koga; Isao Kawahara, both of Hirakata; Yoshimichi Ohtsuka, Kawasaki; Tadashi Kawashima, Tokyo; Yuichi Ninomiya, Kawasaki, all of Japan

[73] Assignees: Matsushita Electric Industrial Co., Ltd., Osaka; Nippon Hoso Kyokai, Tokyo, both of Japan

[21] Appl. No.: 318,538

[22] Filed: Mar. 3, 1989

[30] Foreign Application Priority Data

Mar. 4, 1988 [JP] Japan .................................. 63-51936

[51] Int. Cl.⁵ .............................................. H03M 1/00
[52] U.S. Cl. ...................................... 341/139; 341/118
[58] Field of Search ....................... 341/118, 126, 139; 323/299, 303

[56] References Cited

U.S. PATENT DOCUMENTS 4,016,557 4/1977 Zitelli et al. .......................... 341/139
4,549,165 10/1985 Brian ..................................... 341/118

Primary Examiner—A. D. Pellinen
Assistant Examiner—Marc S. Hoff
Attorney, Agent, or Firm—Stevens, Davis, Miller & Mosher

[57] ABSTRACT

An automatic gain control system for controlling a gain of an A/D converter automatically by controlling reference voltages of said A/D converter at the time of analog-to-digital conversion of a signal which signal being clamped by a clamp circuit to a clamp level which is set to a center level before entering said A/D converter, comprising a clamp level control circuit for detecting the clamp level from an output of said A/D converter to control the clamp level; a first A/D converter for digital-to-analog converting an output of said clamp level control circuit; an automatic clamp level control system.

8 Claims, 4 Drawing Sheets

FIG. I
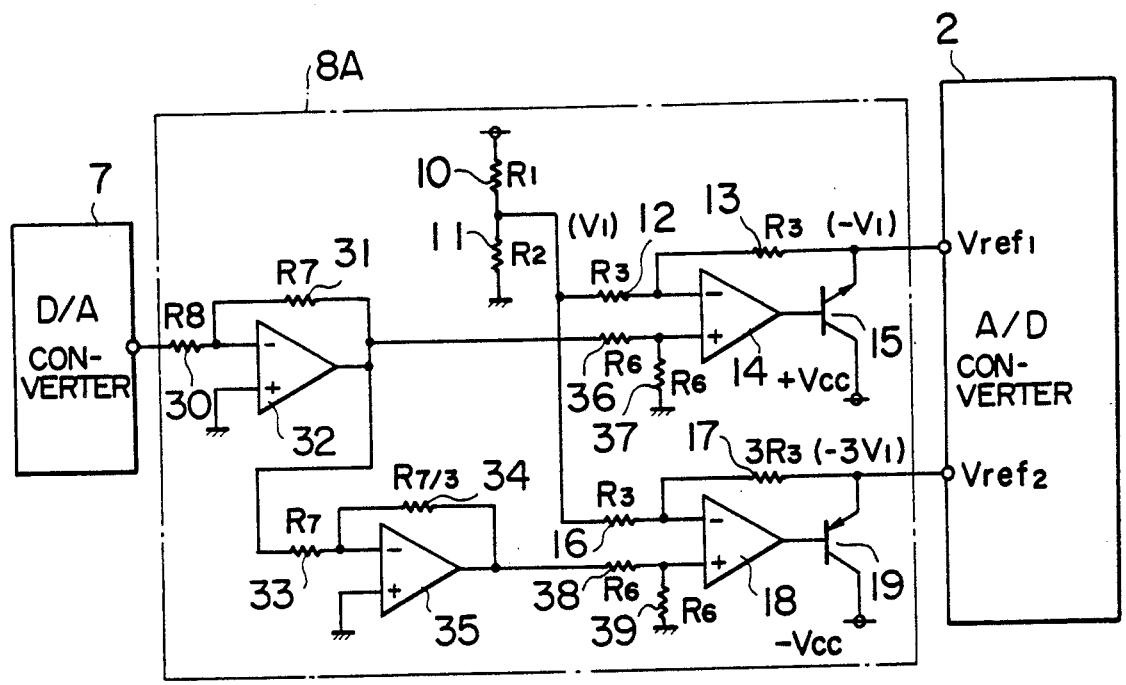
FIG. 2
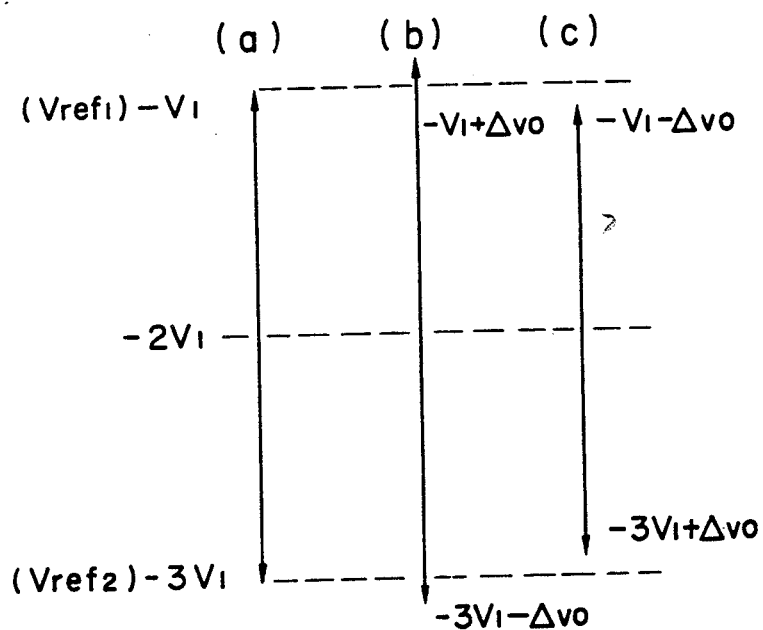

REFERENCE VOLTAGE REGULATION APPARATUS FOR AN AUTOMATIC GAIN CONTROL SYSTEM

BACKGROUND OF THE INVENTION

1. Field of the Invention

The present invention relates to a high definition television receiver for decoding a high definition television signal having a compressed band width to an original high definition television signal, and in particular, to an automatic gain control system for performing a signal level control in converting an analog signal to a digital signal.

2. Description of the Related Art

In order to transmit a high definition television signal by using a broadcasting satellite, a system capable of transmitting a high definition television signal via band width compression has been proposed in "A Satellite First Channel Transmission System for High Definition Television (MUSE)", Television Society Technical Report Material, TEBS 95-2, Vol. 7 No. 441; "A Satellite Broadcasting System of High Vision (MUSE)", Television Society All-Japan Meeting Material, 1987, 12-6.

This system is described in greater detail in the documents mentioned above, and the description thereof is omitted here. However, an arrangement (allocation of signals) of a MUSE signal will be described as to a signal format briefly with reference to FIG. 3.

A synchronizing signal consists of a frame pulse and a horizontal synchronizing signal and they are present respectively in a frame pulse section a and a horizontal synchronizing signal section b. A video signal is a time axis multiplexed signal of a color signal and a luminance signal which are respectively present in a color signal section c and a luminance signal section d. As a signal for controlling, there is a control signal which is present in a control section e. A sound signal is present in a sound/additional information section f together with additional information. Clamp level information is present in a clamp level section g. A horizontal line number is indicated for each of these signals.

FIG. 4 shows the format of the MUSE signal in the form of a waveform. As will be appreciated from the waveform, frame pulses 1 and 2 ar inserted every other field.

In this MUSE signal, a clamp level is at a center level of the amplitude of the MUSE signal, and for example, in the case of quantizing by 8 bits, the clamp level is specified to be at a 128th gradation of 256 gradations. Furthermore, the frame pulse 1 is at a 100% level of the signal amplitude, and it corresponds to a white clip level and a 239th gradation of the 256 gradations. The frame pulse 2 is at a 0% level of the signal amplitude, and it corresponds to a black level and is specified at a 16th gradation of the 256 gradations.

FIG. 5 is a block diagram of a prior art automatic gain control system. The reference numeral 1 designates a clamping circuit for softly clamping a horizontal synchronizing signal period of a MUSE signal by a horizontal pulse, 2 an A/D converter for converting the clamped MUSE signal to a digital signal, and 3 a clamp level control circuit for generating a clamp level control signal by detecting a difference digitally between a level of the 128th gradation of 256 gradations (referred to as a 128/256 level) and a level indicated by clamp level information in each of horizontal line numbers 563 and 1125. Reference numeral 4 designates a D/A converter for converting a digital signal for controlling the clamp level delivered from the clamp level control circuit 3 into an analog signal. Reference numeral 5 designates a DC level control circuit for controlling an offset of a DC voltage so that the clamp level control voltage from the D/A converter 4 becomes a clamp voltage optimum to the specification of the input of the A/D converter 2. Reference numeral 6 designates a frame pulse control circuit for generating a frame pulse level control signal by detecting differences digitally as to the amplitudes of the frame pulses, between a level indicated by information of the frame pulse No. 1 in a horizontal line number 1 and a 239/256 level, and between a level indicated by information of the frame pulse No. 2 in a horizontal line number 2 and a 16/256 level. Reference numeral 7 designates a D/A converter for converting a digital signal from the frame pulse level control circuit 6 into an analog signal. Reference numeral 8 designates a reference voltage control circuit for generating reference voltages for deciding a conversion range of the A/D converter 2 by the frame pulse level control voltage from the D/A converter 7.

In the prior art automatic gain control system as arranged as mentioned above, the clamping circuit 1, A/D converter 2, clamp level control circuit 3, D/A converter 4, and DC level control circuit 5 constitute an automatic clamp level control loop. Furthermore, the A/D converter 2, frame pulse level control circuit 6, D/A converter 7, and reference voltage control circuit 8 constitute an automatic amplitude control loop. When a MUSE signal of a normal amplitude is applied to the automatic gain control system, it is controlled so that each output voltage of the D/A converter 4 and the D/A converter 7 is zero voltage. In this case, when the automatic amplitude control loop is turned off and the A/D converter 2 is being supplied with normal reference voltages without changing the control of the reference voltages, even when the amplitude of the MUSE signal is increased or decreased from the normal amplitude, no clamp level change is caused in the clamped output of the clamping circuit 1 because the MUSE signal is clamped at its center amplitude value (an equivalent level to the clamp level line), and this clamped output is inputted to the A/D converter 2. As a result, the operation of the clamp level control circuit 3 is not changed, and the D/A converter 4 and the DC level control circuit 5 are also not changed. In other words, it is configured such that when the automatic amplitude control loop is maintained turned off, the automatic clamp level control loop is not affected by an amplitude change in the MUSE signal. However, where the automatic amplitude control loop is being turned on, the automatic clamp level control loop is also affected. The operation in such a case will now be described.

FIG. 6 shows a concrete circuit of the reference voltage control circuit 8. Resistors 10 and 11 having resistances R1 and R2 generates a voltage V1 at the junction point thereof. Resistors 12 and 13, an operational amplifier 14, and a transistor 15 constitute an inverted amplifier having a gain of 1 time, and it supplies a voltage $-V1$ as a reference voltage (Vref1) to the A/D converter 2. Resistors 16 and 17, an operational amplifier 18, and a transistor 19 constitute an inverted amplifier having a gain of 3 times, and it supplies a voltage $-3V1$ as a reference voltage (Vref2) to the A/D converter 2. Resistors 20 and 21, and an operational amplifier 22 constitute an inverted amplifier having a gain of 1 time, and resistors 23 and 24 generate a voltage Vl at the junction point thereof, and an offset voltage Vl is applied to the inverted amplifier. A resistor 25 serves as a gain adjusting resistor for controlling the reference voltages of the A/D converter 2 by a control output voltage of the D/A converter 7.

In the reference voltage control circuit 8 as configured as mentioned above, when a MUSE signal inputted has a normal amplitude, the output voltage of the D/A converter 7 becomes zero voltage. As a result, the output of the operational amplifier 22 is a voltage Vl, and no current flows through the resistor 25. Thus, the divided voltage Vl of the resistors 10 and 11 is not changed, and the reference voltages of the A/D converter 2 become respectively −Vl and −3Vl.

FIG. 7 shows various conditions of the reference voltages of the A/D converter 2, in which when the input level is normal, the reference voltages are shown at a.

Now it is supposed that, the level of the inputted MUSE signal is increased by about 1 dB from the normal level. The frame pulse level control circuit 6 detects a difference between a frame pulse level and a normal level, and generates a digital difference signal for controlling the level of the frame pulse having the amplitude increasing. The digital difference signal is supplied to the D/A converter 7. The D/A converter 7 generates at its output a voltage −Vo. This voltage −Vo is supplied to the operational amplifier 22 and an output of a voltage Vl+Vo is produced. A current flows through the resistor 25 to the voltage dividing point of the resistors 10 and 11 to produce a voltage Vl+Δvo. As a result, the reference voltages of the A/D converter 2 become respectively (−Vl −Δvo) and (−Vl −3Δvo). An increment in the dynamic range of both the reference voltages is 2Δvo, and since this increment corresponds to about 1 dB, this increment in the range corresponds to an increment in the amplitude inputted to the A/D converter 2. As described above, although the dynamic range of the A/D converter 2 can be retained, a DC voltage shift of the reference voltages amounting to −2Δvo is generated. This condition is shown at b in FIG. 7.

Next, it is supposed that the level of the inputted MUSE signal is decreased by about 1 dB from the normal level. Similarly to the foregoing, the frame pulse level control circuit 6 generates a digital difference signal for controlling the level of a frame pulse whose amplitude is decreased, and the D/A converter 7 generates a voltage +Vo at the output thereof. This voltage +Vo is supplied to the operational amplifier 22, and a voltage Vl−Vo is outputted. A current flows from the voltage dividing point of the resistors 10 and 11 through the resistor 25. As a result, a voltage Vl−Δvo is generated at the voltage dividing point of the resistors 10 and 11. Consequently, the reference voltages of the A/D converter 2 become respectively (−Vl+Δvo) and (−Vl+3Δvo). A decrement in the dynamic range of both the reference voltages is 2Δvo, and since this decrement corresponds to about 1 dB, this decrement in the range corresponds to a decrement in the amplitude inputted to the A/D converter 2. In this manner, although the dynamic range of the A/D converter 2 can be insured, a DC voltage shift of the reference voltages amounting to +2Δvo is generated. This condition is shown at in FIG. 7.

However, the prior art automatic gain control system configured as described above involves a problem in that when the input level of a MUSE signal is increased or decreased from a normal level, the automatic amplitude control loop is operated and the two reference voltages of the A/D converter are changed. Thus, although the dynamic range can be ensured, since the two reference voltages change in the same direction, the center potential is shifted. Accordingly, in order to correct this, it is necessary that the automatic clamp level control loop is also operated. In other words, the automatic amplitude control loop and the automatic clamp level control loop have to be controlled simultaneously. However, the response characteristics and the loop gains of the two loops are complicated, and an input range corresponding to the reference voltages of the A/D converter is biased to one side, and it is difficult to maintain a satisfactory linearity.

SUMMARY OF THE INVENTION

The present invention was made in view of the problems mentioned above, and it is an object of the invention to provide an automatic gain control system in which reference voltages of an A/D converter is generated by an automatic amplitude control loop without affecting an automatic clamp control loop adversely.

An automatic gain control system in the present invention comprises an A/D converter for analog-to-digital converting a signal whose clamp level is set at a center level, a frame pulse level control circuit for detecting a frame pulse level from an output of the A/D converter to control the frame pulse level, a D/A converter for digital-to-analog converting an output of the frame pulse level control circuit, and a reference voltage control circuit for controlling reference voltages by an output of the D/A converter so that the two reference voltages are changed symmetrically with respect to a standard potential.

In the automatic gain control system in the present invention, when a signal inputted is increased or decreased the generation of the reference voltages of the A/D converter is controlled such that the reference voltages are generated equivalently symmetrically above and below the standard voltage respectively. Accordingly, it is not necessary to change a clamp voltage before the analog-to-digital conversion. For this reason, the automatic clamp level control loop is not operated simultaneously with the automatic amplitude control loop, and only the automatic amplitude control loop is required to be operated. Thus, the response characteristics of the two loops are not complicated. Furthermore, since the reference voltages are controlled symmetrically with respect to the standard voltage above and below thereof, the input range of the A/D converter is not biased to one side, and the problem of non-linearity ca be solved.

BRIEF DESCRIPTION OF THE DRAWINGS

FIG. 1 is a circuit diagram of a reference voltage control circuit of an automatic gain control system in an embodiment of the invention; FIG. 2 is a diagram for illustrating the operation of the embodiment.

DESCRIPTION OF THE PREFERRED EMBODIMENTS

Figure 3:
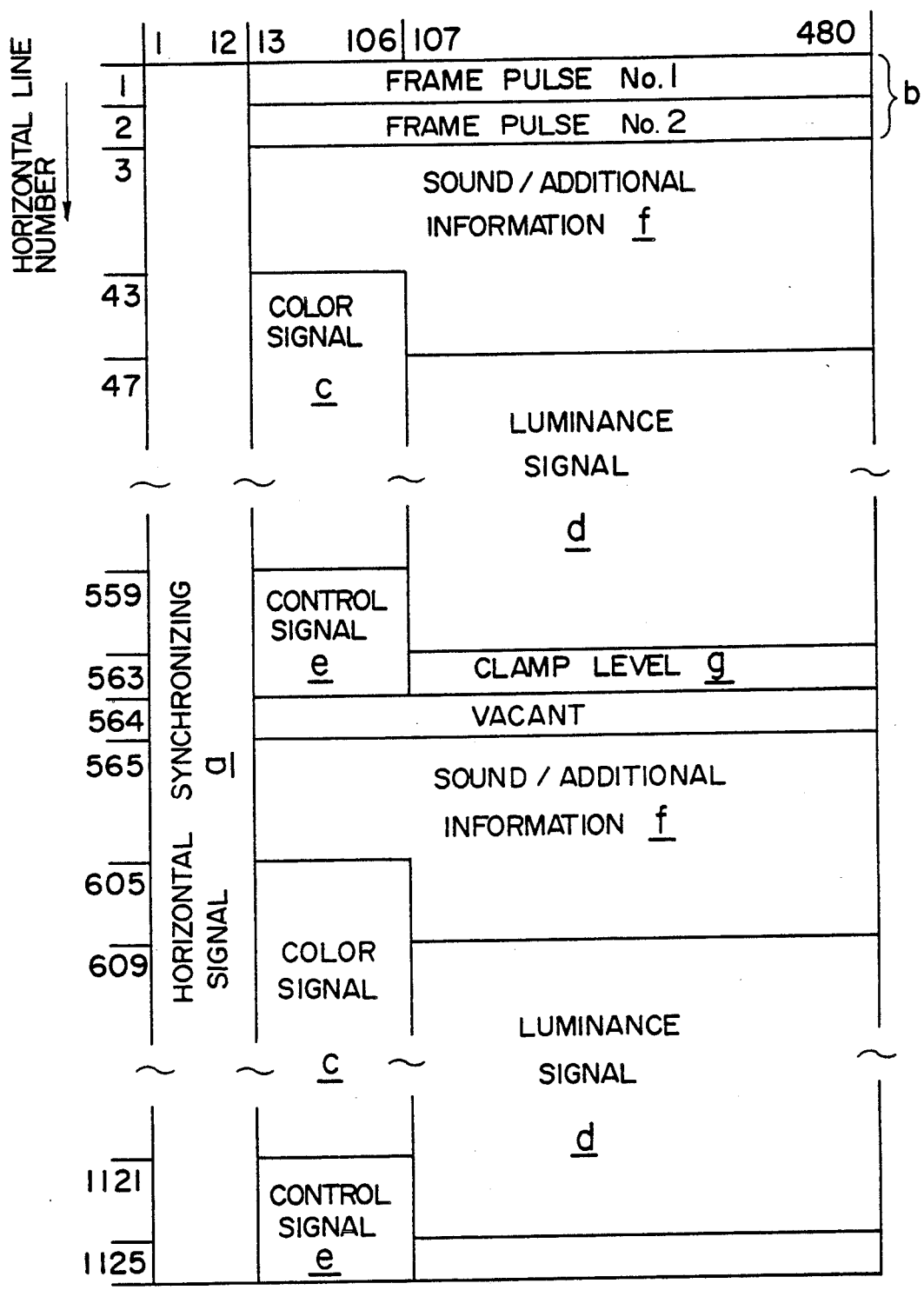
FIG. 3 is a signal configuration diagram of a MUSE signal.
Figure 4:
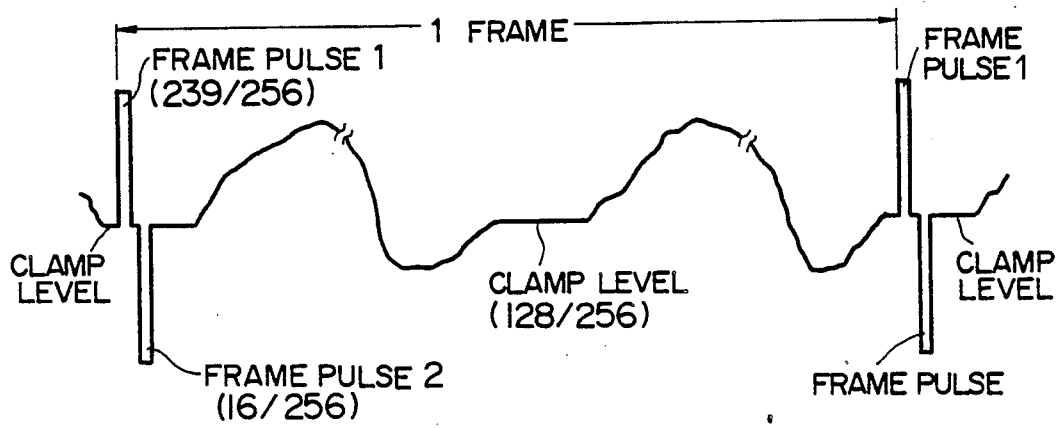
FIG. 4 is a waveform diagram of the MUSE signal.
Figure 5:
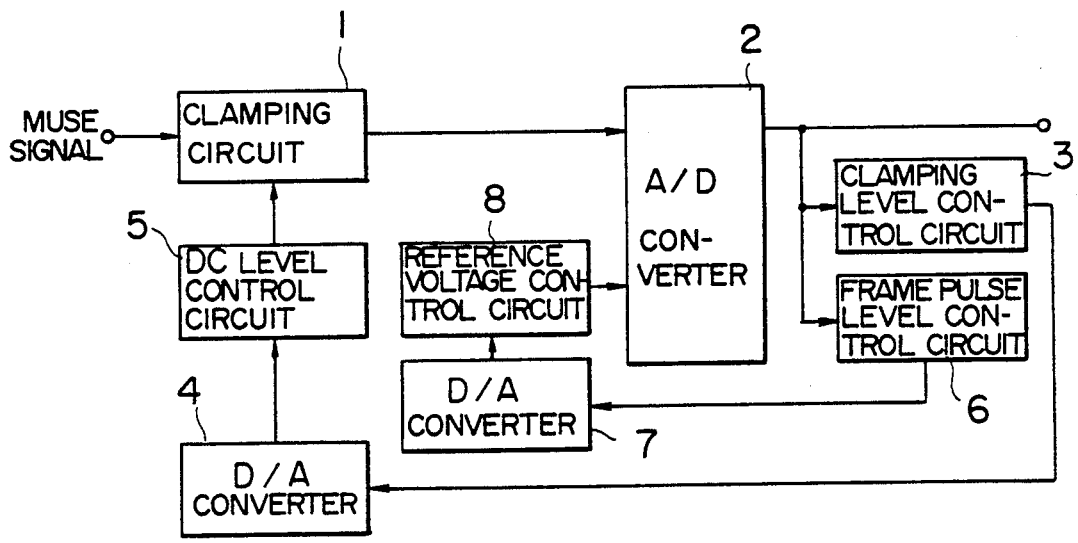
FIG. 5 is a block diagram of a prior art automatic gain control system.
Figure 6:
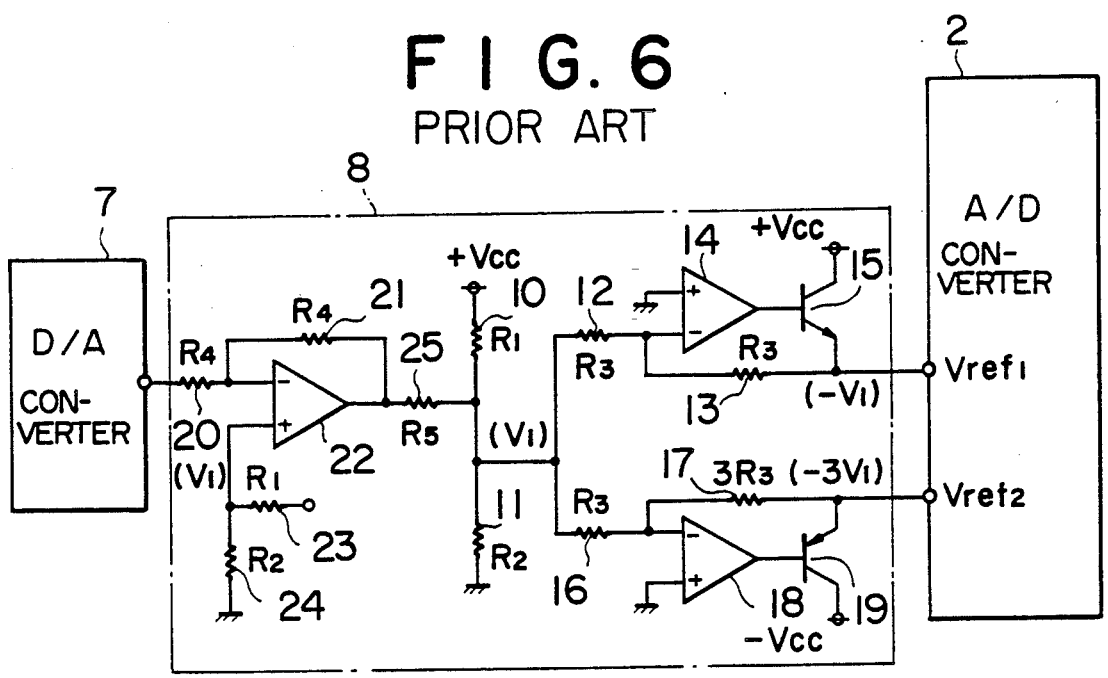
FIG. 6 is a circuit diagram of a reference voltage control circuit in the automatic gain control system of FIG. 5.
Figure 7:
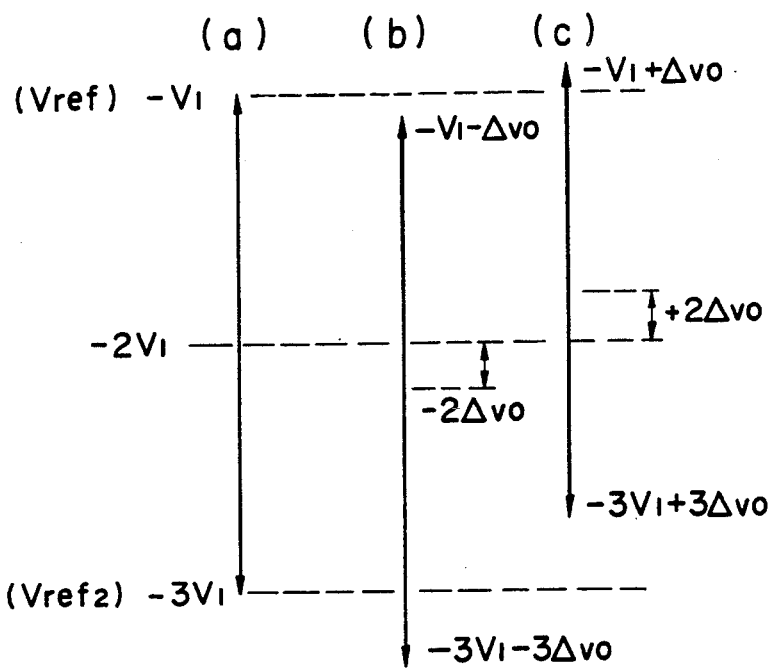
FIG. 7 is a diagram for illustrating the operation of the prior art system of FIG. 5.

FIG. 1 shows a concrete circuit diagram of a reference voltage control circuit of an automatic gain control system of an embodiment of the invention. In FIG. 1, identical elements to those shown in FIG. 6 are designated by the identical reference numerals. Resistors 10 and 11 have resistances R1 and R2 respectively, and produce a voltage Vl at a voltage dividing point (junction point) thereof. Resistors 12 and 13, an operational amplifier 14, and a transistor 15 constitute an inverted amplifier having a gain of 1 time, and it supplies a voltage $(-Vl)$ as a first reference voltage (Vref1) to an A/D converter 2. Resistors 16 and 17, an operational amplifier 18, and a transistor 19 constitute an inverted amplifier having a gain of 3 times, and it supplies a voltage $(-3Vl)$ as a second reference voltage (Vref2) to the A/D converter 2. Resistors 30 and 31, and an operational amplifier 32 constitute an inverted amplifier, and it amplifies an output of a D/A converter 7. The gain is determined by the ratio of a resistance R7 to a resistance R8, i.e., R7/R8 of the resistors 31 and 30. The output of the operational amplifier 32 is divided b resistors 36 and 37 into two halves, and the divided output is supplied to a positive input terminal of the operational amplifier 14. The output of the operational amplifier 32 is also supplied to an inverted amplifier constituted by resistors 33 and 34 and an operational amplifier 35, and having a gain of ⅓ times. The output of the operational amplifier 35 is divided by resistors 38 and 39 into two halves, and the divided output is supplied to a positive input terminal of the operational amplifier 18.

The operation of the reference voltage control circuit 8A of the embodiment configured as mentioned above will be described.

When a MUSE signal has a normal amplitude, the output voltage of the D/A converter 7 becomes zero voltage. As a result, the output of the operational emplifier 32 becomes zero voltage and the output of the operational amplifier 35 becomes also zero voltage, and the first and second reference voltages of the A/D converter 2 become respectively $(-Vl)$ and $(-3Vl)$. The condition of the reference voltages of the A/D converter 2 is shown in FIG. 2, and when the input level of the input MUSE signal is normal, this condition is shown at (a) in FIG. 2.

Next, when the input level of the inputted MUSE signal is increased by about 1 dB from the normal level, the reference pulse level control circuit 6 detects a difference between a frame pulse and the normal level, and a digital difference signal for controlling the level of the frame pulse having an increased amplitude is generated. The digital difference signal is supplied to the D/A converter 7, and it generates a voltage $-Vo$ at the output thereof. This voltage $-Vo$ is supplied to the inverted amplifier constituted by the resistors 30 and 31, and the operational amplifier 32, and the output of the operational amplifier 32 becomes $\Delta 2vo$. This output $\Delta 2vo$ is supplied to the inverted amplifier constituted by the resistors 33 and 34, and the operational amplifier 35, and the output of the operational amplifier 35 becomes $-\Delta 2vo/3$. The output $\Delta 2vo$ of the operational amplifier 32 is also supplied to the operational amplifier 14 through the resistors 36 and 37. However, due to the voltage dividing resistors 36 and 37, a voltage vo is actually supplied to the operational amplifier 14. Accordingly, the first reference voltage (Vref1) of the A/D converter 2 becomes $(-Vl+\Delta vo)$. Further, the output $\Delta 2vo/3$ of the operational amplifier 35 is supplied to the operational amplifier 18 through the resistors 38 and 39, however, actually, a voltage $-\Delta vo/3$ is supplied to the operational amplifier 18. Accordingly, the second reference voltage (Vref2) of the A/D converter 2 becomes $(-3Vl-\Delta vo)$. An increment in the dynamic range of both the reference voltages is $2\Delta vo$, since this increment corresponds to about 1 dB. This increment in the range corresponds to an increment in the amplitude inputted to the A/D converter 2. The condition of the reference voltages is shown at b in FIG. 2 in which the reference voltages are respectively increased and decreased symmetrically above and below with respect to the standard voltage $-2Vl$.

Next, when the signal level of the inputted MUSE signal is decreased by about 1 dB from the normal level, the control is performed in a similar manner as described above. Specifically, the D/A converter 7 generates a voltage Vo, and the output of the operational amplifier 32 becomes $-\Delta 2vo$, and the output of the operational amplifier 35 becomes $\Delta 2vo/3$. These control voltages $-\Delta 2vo$ and $\Delta 2vo/3$ are respectively supplied to the operational amplifiers 14 and 18 through predetermined resistors to produce the first and second reference voltages $(-Vl-\Delta vo)$ and $(-3Vl+\Delta vo)$ for the A/D converter 2. A decrement in the dynamic range of both the reference voltages is $2\Delta vo$, and since this decrement corresponds about 1 dB, the decrement in the range corresponds to a decrement in amplitude inputted to the A/D converter 2. The condition of the reference voltages is shown at c in FIG. 2 in which the first and second reference voltages respectively decreased and increased symmetrically with respect to the standard voltage $-2Vl$ above and below thereof.

In this embodiment, the invention is described with respect to a system for analog-to-digital converting a MUSE signal. However, it will be apparent that the present invention can be applied to any signal which has a clamp level set to a center level.

In the present invention, the reference voltages of the A/D converter are controlled by the automatic amplitude control loop. However, since the generation of the reference voltages is controlled equivalently symmetrically above and below the standard voltage, there is no need to change the clamp voltage before the analog-to-digital conversion. As a result, the clamp level control loop is not operated simultaneously with the automatic amplitude control loop, and only the automatic amplitude control loop is operated. Thus, the response characteristics of the two control loops do not become complicated, and the control loop system is stable. Further, the input range of the A/D converter is not biased to one side, and a satisfactory linearity area of the A/D converter can be used. Accordingly, a significant practical advantage is provided.

We claim:

1. An automatic gain control system for level-clamping and A/D converting an input video signal containing a frame pulse and having a clamp level to be set at a center level of the signal, said system comprising:

level clamping means for controllably clamping the level of said input signal to produce an output signal level-clamped to said center level;

A/D converter means receiving said output signal from said level clamping means and having two reference voltage inputs for respectively receiving two controllable reference-voltages, said A/D converter means for controllably converting said output signal to a digital output signal;

means for providing a detected digital clamp level output signal indicating a digital level of the clamp level from said digital output signal;

first control means, responsive to said detected digital clamp level output signal, for controlling said level clamping means;

means for providing a detected digital frame pulse level output signal indicating a digital level of the frame pulse from said digital output signal;

second control means, responsive to the detected digital frame pulse level output signal, for controlling said two controllable reference-voltages provided to said A/D converter means; said second control means including a D/A converter means for digital-to-analog converting said detected digital frame pulse level output signal to produce a corresponding analog output signal, first reference voltage control means for polarity-inverting and adding said analog output signal to a predetermined fixed reference voltage produce a first reference voltage of said two reference voltages provided to said a/D converter means and a second reference voltage control means for adding said analog output signal to said predetermined fixed reference voltage produce a second reference voltage of said two reference voltages provided to said A/D converter, thereby maintaining a center value of said first and second reference voltages to be a predetermined constant value.

2. A system according to claim 1, wherein said input signal is a MUSE signal.

3. An automatic gain control system for level-clamping and A/D converting an input video signal containing a frame pulse and having a clamp level to be set at a center level of the signal, said system comprising:

level clamping means for controllably clamping the level of said input signal to produce a corresponding output signal level-clamped to said center level;

A/D converter means receiving said output signal from said clamping means and having first and second reference voltage inputs for respectively receiving first and second controllable reference-voltages VREF1 and VREF2, said A/D converter means for controllably converting said output signal to a digital output signal;

means for providing a detected digital clamp level output signal indicating a digital level of the clamp level of said digital output signal and for controlling said clamping means; and reference-voltage control means, including a D/A converter means, for providing a detected digital frame pulse level output signal indicating a digital level of the frame pulse from said digital output signal, converting the detected digital frame pulse level output signal to a corresponding analog output signal and controlling said first and second controllable reference voltages VREF1 and VREF2 provided to said A/D converter means in response to said analog output signal, wherein said control means includes a first control means for subtractively adding a voltage of said analog output signal to a predetermined fixed reference voltage to control the magnitude of said first reference voltage VREF1 and a second control means for adding a voltage of said analog output signal to said fixed reference voltage to control the magnitude of said second reference voltage VREF2, thereby causing any magnitude variations of said first and second reference voltages to be symmetrical with respect to a center potential of predetermined desired magnitudes of said first and second reference voltages VREF1 and VREF2.

4. A system according to claim 3, wherein said desired magnitude of VREF1 is equal to said desired magnitude of VREF2 multiplied by a constant k and said second control means comprises a first operational amplifier circuit including an inverting input of negative unity gain for receiving and inverting said predetermined fixed reference voltage and a noninverting input of positive unity gain for receiving and amplifying said analog input signal of said D/A converter means to produce said first reference voltage VREF1 and a second operational amplifier circuit including an inverting input of negative gain equal to $-k$ and an inverting input of negative unity gain to produce said second reference voltage VREF2.

5. A system as in claim 4, wherein when said analog output signal of said D/A converter means is zero, VERF1 and VREF2 are equal to said desired magnitudes of VREF1 and VREF2 respectively.

6. A system as in claim 3, wherein said input video signal is a high definition TV signal.

7. A system as in claim 3, wherein said input video signal is a MUSE signal.

8. In a system including a level-clamping circuit and an A/D converter to clamp an input signal having a clamp level to be set at a center level of the signal and controlling first and second reference voltages of said A/D converter for A/D converting the clamped input signal, a reference voltage control apparatus for automatic gain regulation comprising:

a clamp level control circuit for detecting the clamp level from an output of said a/D converter to control the clamp level;

a first D/A converter for digital-to-analog converting an output of said clamp level control circuit;

an automatic clamp level control system for supplying an output of said first D/A converter to said clamp circuit as a clamp level control voltage of said clamp level control circuit;

a frame pulse level control circuit for detecting a frame pulse level from the output of said A/D converter to control the frame pulse level;

a second D/A converter for digital-to-analog converting an output of said frame pulse level control circuit; and a first reference voltage control circuit for polarity-inverting and adding an output of said second D/A converter to a predetermined fixed reference voltage produce said first reference voltage of said A/D converter, a second reference voltage control circuit for adding the output of said second D/A converter to said predetermined fixed reference voltage produce the second reference voltage of said D/A converter, thereby maintaining a center value of said first and second reference voltages to be a constant value.

* * * * *